United States Patent
Chen

(10) Patent No.: US 8,300,847 B2
(45) Date of Patent: Oct. 30, 2012

(54) DE-POP CIRCUIT AND AN ASSOCIATED AUDIO SYSTEM

(75) Inventor: Chih-Hsiung Chen, Tainan (TW)

(73) Assignee: Himax Technologies Limited, Tainan County (TW)

( * ) Notice: Subject to any disclaimer, the term of this patent is extended or adjusted under 35 U.S.C. 154(b) by 323 days.

(21) Appl. No.: 12/787,109

(22) Filed: May 25, 2010

(65) Prior Publication Data

US 2011/0293110 A1    Dec. 1, 2011

(51) Int. Cl.
*H04B 15/00* (2006.01)
(52) U.S. Cl. ...................................................... 381/94.5
(58) Field of Classification Search ................. 381/94.5, 381/96, 97
See application file for complete search history.

(56) References Cited

U.S. PATENT DOCUMENTS 6,282,296 B1*  8/2001  Konno et al. .................... 381/96
2004/0101148 A1*  5/2004  Pyle et al. ...................... 381/101

OTHER PUBLICATIONS http://en.wikipedia.org/wiki/adder_(electronics); 4 pages, date unkown.*
radio-electronics.com; 5 pges; Dec. 24, 2004.*

* cited by examiner

*Primary Examiner* — Ping Lee
(74) *Attorney, Agent, or Firm* — Stout, Uxa, Buyan & Mullins, LLP

(57) ABSTRACT

A de-pop circuit adaptable to an audio circuit is disclosed. A high-pass filter generates a high-pass output signal according to an output signal of the audio circuit. A blockage circuit receives the high-pass output signal and a control signal, and generates an enable signal to activate the audio circuit according to the control signal and the high-pass output signal.

16 Claims, 3 Drawing Sheets

| CTR | HP | EN |
|-----|----|----|
| 1   | 0  | 1  |
| 1   | 1  | 0  |
| 0   | 0  | 0  |
| 0   | 1  | 1  |

CTR: "1" power-off
      "0" power-on

DE-POP CIRCUIT AND AN ASSOCIATED AUDIO SYSTEM

BACKGROUND OF THE INVENTION

1. Field of the Invention

The present invention generally relates to an audio system, and more particularly to an audio system with a de-pop circuit.

2. Description of Related Art

A digital-to-analog converter (DAC) is usually adopted in a digital system, such as an audio system, to convert a digital signal to an analog signal, which is then used to drive an electro-acoustic transducer such as a loudspeaker. Owing to mismatch of charging and discharging rates of the capacitors used in the audio system, high-frequency signal may be commonly generated during power-on or power-off transient, thereby making unfavorable pop noise emanated from the loudspeaker.

For the reason that conventional audio system ordinarily suffers from the pop noise, a need has arisen to propose a novel de-pop circuit in order to effectively and economically suppress the pop noise in the audio system during power-on, power-off transients or other situations in which pop noise occurs.

SUMMARY OF THE INVENTION

In view of the foregoing, it is an object of the embodiment of the present invention to provide a de-pop circuit and an audio system with de-pop circuit that is capable of reducing pop noise.

According to one embodiment, an audio system with a de-pop circuit includes a transducer, an audio circuit, a high-pass filter and a blockage circuit. The audio circuit is configured to drive the transducer. The high-pass filter generates a high-pass output signal according to an output signal of the audio circuit. The blockage circuit couples to receive the high-pass output signal and a control signal, and generates an enable signal to activate the audio circuit according to the control signal and the high-pass output signal.

DETAILED DESCRIPTION OF THE INVENTION

Figure 1:
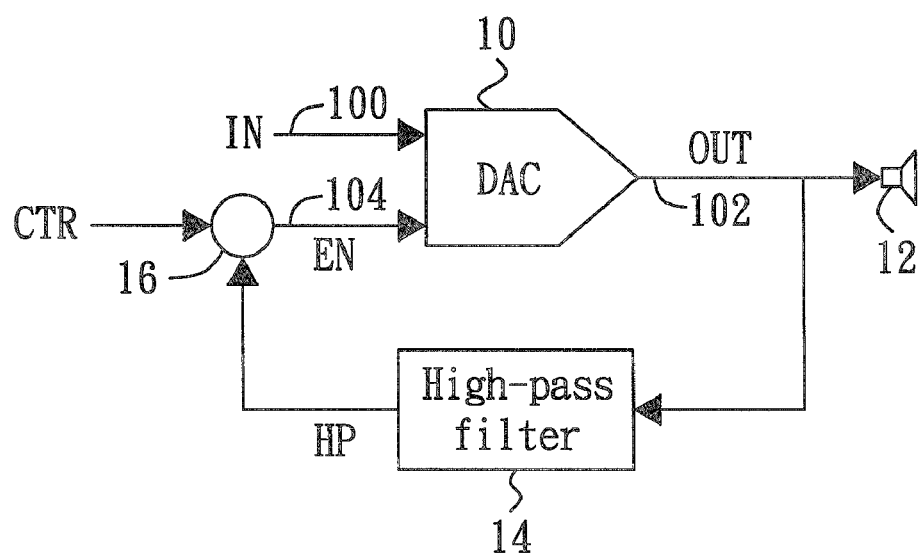
FIG. 1 shows an audio system with a de-pop circuit according to one embodiment of the present invention.

FIG. 1 shows an audio system 1 with a de-pop circuit according to one embodiment of the present invention. In the embodiment, the audio system 1 includes an audio circuit such as a digital-to-analog converter (DAC) 10 that converts a digital input signal IN (at an input signal node 100) to an analog output signal OUT (at an output signal node 102) for driving, directly or indirectly, a transducer such as a loudspeaker 12. Although the DAC 10 is demonstrated in the embodiment, other audio circuits such as an audio amplifier may be used instead. The term "audio" may denote the frequency range between about 12 hertz and 20,000 hertz, the human range of hearing. However, the present invention may be applied to other species, such as dogs, having different range of hearing.

In the embodiment, the DAC 10 has an enable input node 104 that receives an enable signal EN to turn on or turn off the DAC 10. For example, the DAC 10 is powered on when the enable signal EN becomes low ("0"), and the DAC 10 is powered off when the enable signal EN becomes high ("1"). The audio system 1 receives a control signal CTR that is used to turn on the DAC 10 (with level "0") or turn off the DAC 10 (with level "1"). Specifically, an active control signal CTR ("0") activates (or turns on) the DAC 10, and an inactive control signal CTR ("1") deactivates (or turns off) the DAC 10. Although the enable signal EN and the control signal CTR are used in the embodiment to turn on or turn off the DAC 10, it is appreciated that, in other embodiment, these signals may be used, for example, to increase or decrease the amplification of the audio circuit. Generally speaking, these signals may be used to activate or deactivate the audio circuit 10.

Figure 2A:
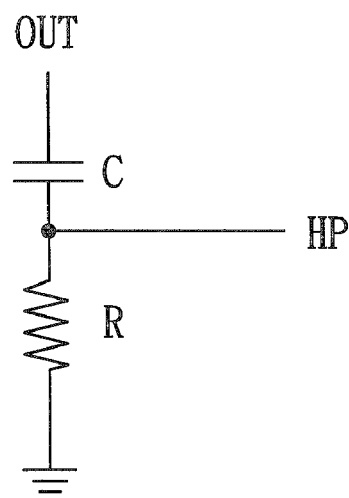
FIG. 2A and FIG. 2B show exemplary high-pass filters.

The de-pop circuit of the embodiment includes a high-pass filter 14 and a blockage circuit 16. The high-pass filter 14 receives the analog output signal OUT and passes high-frequency component with frequency higher than a cutoff frequency but attenuates low-frequency component with frequency lower than the cutoff frequency. For example, when the analog output signal OUT possesses abrupt change, the high-pass output signal HP of the high-pass filter 14 accordingly generates an active signal such as a high-level signal. Otherwise, the high-pass output signal HP of the high-pass filter 14 generates an inactive signal such as a low-level signal. The high-pass output signal HP of the high-pass filter 14 is then fed to the blockage circuit 16. The cutoff frequency is a design parameter above which pop noise may be perceived. In an exemplary embodiment, the high-pass filter 14 may be a resistor-capacitor (RC) circuit configured as shown in FIG. 2A. Specifically, the RC circuit includes a capacitor C and a resistor R that are serially connected between the analog output signal OUT and ground. The node coupled between the capacitor C and the resistor R provides the high-pass output signal HP of the high-pass filter 14. The cutoff frequency mentioned above may be adjusted by varying the values of R and C.

Figure 2B:
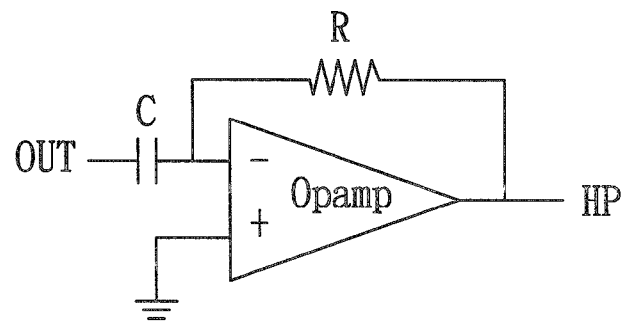

In another exemplary embodiment, the high-pass filter 14 may be a differentiator configured as shown in FIG. 2B. Specifically, the differentiator includes an operational amplifier (OPamp), a resistor R coupled between the OPamp output and the inverting input of the OPamp, and a capacitor C coupled between the inverting node and the analog output signal OUT. The non-inverting input of the OPamp is connected to ground, and the OPamp output provides the high-pass output signal HP of the high-pass filter 14. The cutoff frequency mentioned above may be adjusted by varying the values of R and C. The OPamp output (i.e., HP) is proportional to the time derivative of the OPamp input (i.e., the analog output signal OUT) with sign reversed, and may be expressed as follows:

$$HP = -RC\frac{dOUT}{dt}$$

Figure 3:
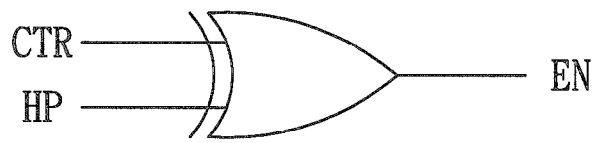
FIG. 3 shows a blockage circuit implemented by an exclusive OR (XOR) logic gate with an accompanied truth table.

In the embodiment, the blockage circuit 16 may be, but not limited to, an exclusive OR (XOR) logic gate configured as shown in FIG. 3. According to the accompanied truth table shown in FIG. 3, when the control signal CTR is "1" (that intends to turn off the DAC 10) and the signal HP is "0" (that indicates no high component), the enable signal EN becomes "1", thereby turning off the DAC 10. On the other hand, when the control signal CTR is "1" (that intends to turn off the DAC 10) but the signal HP is "1" (that indicates existing high component), the enable signal EN becomes "0", thereby turning on the DAC 10.

Similarly, when the control signal CTR is "0" (that intends to turn on the DAC 10) and the signal HP is "0" (that indicates no high component), the enable signal EN becomes "0", thereby turning on the DAC 10. On the other hand, when the control signal CTR is "0" (that intends to turn on the DAC 10) but the signal HP is "1" (that indicates existing high component), the enable signal EN becomes "1", thereby turning off the DAC 10. In summary, the enable signal EN is the inverse of the control signal CTR when high component (i.e., "1" HP) exists. In other words, the blockage circuit 16 inverses the control signal CTR when the high-pass output signal HP becomes active.

Figure 4:
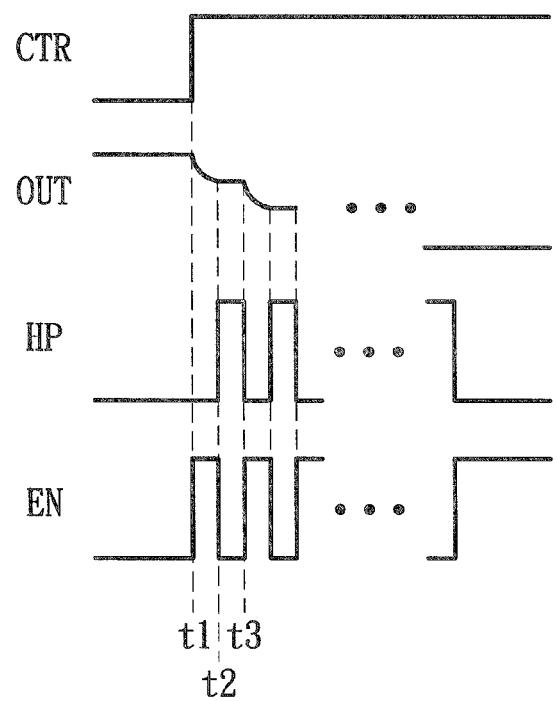
FIG. 4 shows exemplary waveforms that illustrate one scenario of turning off the DAC according to the embodiment.

FIG. 4 shows exemplary waveforms that illustrate one scenario of turning off the DAC 10 according to the embodiment. During time t1-t2, the enable signal EN becomes "1" because of "1" CTR and "0" HP, thereby the analog output signal OUT falls. The falling signal OUT, however, results in "1" HP during time t2-t3. The "1" HP thus makes the enable signal EN become "0", thereby turning on the DAC 10. The turn-on DAC 10 therefore prevents the falling signal OUT from generating power-off pop noise. The operation in t1-t2 and the operation in t2-t3 are iterated a number of times, until the analog output signal OUT approaches the lowest level and thus finishes the power-off without power-off pop noise.

Figure 5:
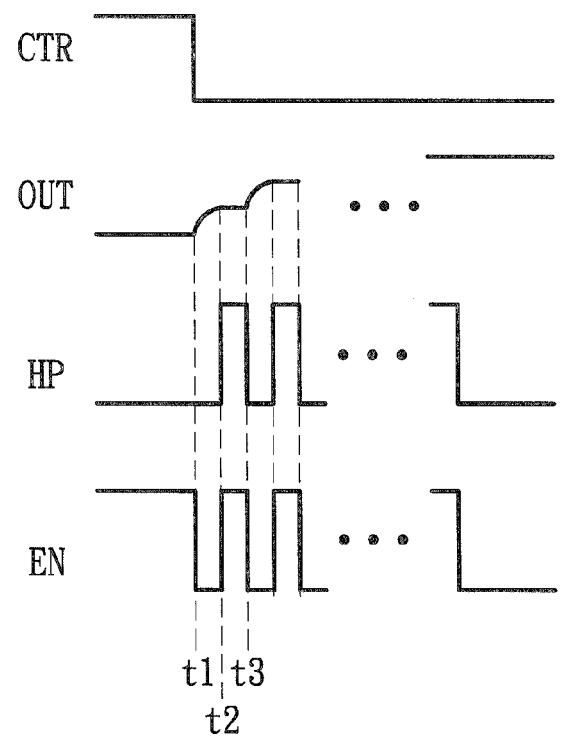
FIG. 5 shows exemplary waveforms that illustrate one scenario of turning on the DAC according to the embodiment.

FIG. 5 shows exemplary waveforms that illustrate one scenario of turning on the DAC 10 according to the embodiment. During time t1-t2, the enable signal EN becomes "0" because of "0" CTR and "0" HP, thereby the analog output signal OUT rises. The rising signal OUT, however, results in "1" HP during time t2-t3. The "1" HP thus makes the enable signal EN become "1", thereby turning off the DAC 10. The turn-off DAC 10 therefore prevents the rising signal OUT from generating power-on pop noise. The operation in t1-t2 and the operation in t2-t3 are iterated a number of times, until the analog output signal OUT approaches the highest level and thus finishes the power-on without power-on pop noise.

Although specific embodiments have been illustrated and described, it will be appreciated by those skilled in the art that various modifications may be made without departing from the scope of the present invention, which is intended to be limited solely by the appended claims.

What is claimed is:

1. A de-pop circuit adaptable to an audio circuit, comprising:
    a high-pass filter configured to generate a high-pass output signal according to an output signal of the audio circuit; and
    a blockage circuit coupled to receive the high-pass output signal and a control signal, the blockage circuit generating an enable signal to activate the audio circuit according to the control signal and the high-pass output signal;
    wherein the control signal becomes active to power on the audio circuit, the audio circuit is turned on initially and level of the output signal of the audio circuit is rising, and the rising level makes the high-pass output signal active and therefore turns off the audio circuit again;
    whereby the audio circuit is iteratively turned on and off until the output signal of the audio circuit approaches a highest level and thus finishes the power on operation without power-on pop noise.

2. The de-pop circuit of claim 1, wherein the high-pass output signal becomes active when high-frequency component with frequency higher than a cutoff frequency exists at the output signal of the audio circuit.

3. The de-pop circuit of claim 1, wherein the high-pass filter comprises:
    a resistor-capacitor circuit having a capacitor and a resistor that are serially connected between the output signal of the audio circuit and ground;
    wherein a node between the capacitor and the resistor provides the high-pass output signal.

4. The de-pop circuit of claim 1, wherein the high-pass filter comprises:
    an operational amplifier with a non-inverting node connected to ground;
    a resistor coupled between an output of the operational amplifier and an inverting node of the operational amplifier; and
    a capacitor coupled between the inverting node and the output signal of the audio circuit;
    wherein the output of the operational amplifier provides the high-pass output signal.

5. The de-pop circuit of claim 1, wherein the blockage circuit inverses the control signal when the high-pass output signal becomes active.

6. The de-pop circuit of claim 1, wherein the blockage circuit comprises an exclusive OR (XOR) logic gate coupled to receive the control signal and the high-pass output signal to generate the enable signal.

7. The de-pop circuit of claim 1, when the control signal becomes inactive to power off the audio circuit, the audio circuit is turned off initially and level of the output signal of the audio circuit is filling, wherein the falling level makes the high-pass output signal active and therefore turns on the audio circuit again;
    thereby the audio circuit is iteratively turned off and on until the output signal of the audio circuit approaches a lowest level and thus finishes the power off operation without power-off pop noise.

8. An audio system with a de-pop circuit, the audio system comprising:
    a transducer;
    an audio circuit configured to drive the transducer;
    a high-pass filter configured to generate a high-pass output signal according to an output signal of the audio circuit; and
    a blockage circuit coupled to receive the high-pass output signal and a control signal, the blockage circuit generating an enable signal to activate the audio circuit according to the control signal and the high-pass output signal;
    wherein the control signal becomes active to power on the audio circuit, the audio circuit is turned on initially and level of the output signal of the audio circuit is rising, and the rising level makes the high-pass output signal active and therefore turns off the audio circuit again;
    whereby the audio circuit is iteratively turned on and off until the output signal of the audio circuit approaches a highest level and thus finishes the power on operation without power-on pop noise emanated from the transducer.

9. The system of claim 8, wherein the audio circuit comprises a digital-to-analog converter (DAC) that converts a digital put signal to an analog output signal.

10. The system of claim 8, wherein the transducer is a loudspeaker.

11. The system of claim 8, wherein the high-pass output signal becomes active when high-frequency component with frequency higher than a cutoff frequency exists at the output signal of the audio circuit.

12. The system of claim 8, wherein the high-pass filter comprises:
   a resistor-capacitor circuit having a capacitor and a resistor that are serially connected between the output signal of the audio circuit and ground;
   wherein anode between the capacitor and the resistor provides the high-pass output signal.

13. The system of claim 8, wherein the high-pass filter comprises:
   an operational amplifier with a non-inverting node connected to ground;
   a resistor coupled between an output of the operational amplifier and an inverting node of the operational amplifier; and
   a capacitor coupled between the inverting node and the output signal of the audio circuit;
   wherein the output of the operational amplifier provides the high-pass output signal.

14. The system of claim 8, wherein the blockage circuit inverses the control signal when the high-pass output signal becomes active.

15. The system of claim 8, wherein the blockage circuit comprises an exclusive OR (XOR) logic gate coupled to receive the control signal and the high-pass output signal to generate the enable signal.

16. The system of claim 8, when the control signal becomes inactive to power off the audio circuit, the audio circuit is turned off initially and level of the output signal of the audio circuit is falling, wherein the falling level makes the high-pass output signal active and therefore turns on the audio circuit again;
   thereby the audio circuit is iteratively turned off and on until the output signal of the audio circuit approaches a lowest level and thus finishes the power off operation without power-off pop noise emanated from the transducer.

* * * * *